(12) United States Patent
Lin

(10) Patent No.: US 8,048,698 B2
(45) Date of Patent: Nov. 1, 2011

(54) THIN FILM TRANSISTOR ARRAY SUBSTRATE AND METHOD FOR MANUFACTURING THE SAME

(75) Inventor: Hsiang-Lin Lin, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 267 days.

(21) Appl. No.: 12/436,221

(22) Filed: May 6, 2009

(65) Prior Publication Data

US 2010/0187537 A1 Jul. 29, 2010

(30) Foreign Application Priority Data

Jan. 23, 2009 (TW) ................................ 98102888 A

(51) Int. Cl.
*H01L 21/00* (2006.01)
(52) U.S. Cl. .................. 438/34; 257/72; 257/E33.001; 257/E29.273; 257/E21.411
(58) Field of Classification Search .......... 438/30, 438/34, 149, 155; 349/43, 46, 138, 187; 257/59, 72, 88, E33.001, E29.273, E21.411, 257/E21.414, E27.111, E29.291, E29.294, 257/E21.412
See application file for complete search history.

(56) References Cited

U.S. PATENT DOCUMENTS

| | | | |
|---|---|---|---|
| 6,642,580 B1 | 11/2003 | Yun | |
| 6,650,380 B2 | 11/2003 | Song | |
| 6,850,291 B2 | 2/2005 | Song | |
| 7,599,014 B2 | 10/2009 | Shih | |
| 2005/0078264 A1* | 4/2005 | Yoo et al. | 349/152 |
| 2005/0170564 A1 | 8/2005 | Lai | |
| 2006/0258033 A1 | 11/2006 | Cheng et al. | |

FOREIGN PATENT DOCUMENTS

TW I257521 7/2006

OTHER PUBLICATIONS

Chinese language office action dated Apr. 21, 2010.
English language translation of Chinese language office action.

* cited by examiner

*Primary Examiner* — A. Sefer
*Assistant Examiner* — Monica D Harrison
(74) *Attorney, Agent, or Firm* — Thomas, Kayden, Horstemeyer & Risley, LLP

(57) ABSTRACT

A thin film transistor array structure and a method for manufacturing the same are provided. The thin film transistor array structure comprises a substrate, including a transition area and a pad area. A patterned first metal layer is formed on the substrate, wherein the patterned first metal layer includes a data connecting line disposed in the transition area, and a data pad and a gate pad disposed in the pad area. A patterned first insulation layer is formed on the patterned first metal layer. The patterned first insulation layer at least defines a first opening on the gate pad, a second opening on the data pad, and a third opening in the transition area, so as to simplify following processes to increase the yield.

19 Claims, 25 Drawing Sheets

THIN FILM TRANSISTOR ARRAY SUBSTRATE AND METHOD FOR MANUFACTURING THE SAME

This application claims priority to Taiwan Patent Application No. 098102888 filed on Jan. 23, 2009, the disclosures of which are incorporated herein by reference in their entirety.

CROSS-REFERENCES TO RELATED APPLICATIONS

Not applicable.

BACKGROUND OF THE INVENTION

1. Field of the Invention

The present invention relates to a thin film transistor array substrate and a method for manufacturing the same, and more particularly, to a thin film transistor array substrate for a liquid crystal display (LCD) and a method for manufacturing the same.

2. Descriptions of the Related Art

Evolution of associated technologies has led to continuous development of various display manufacturing technologies, for example, those using a planarization insulation layer. According to technologies using the planarization insulation layer, a photosensitive planarization insulation layer is formed prior to formation of a transparent electrode. The planarization insulation layer, which has a thickness generally greater than that of an insulation layer formed of silicon nitride or silicon oxide and a lower dielectric constant, provides both planarization functionality and a desirable insulation effect, which are detailed as follows.

Referring to FIGS. 1A and 1B together, FIG. 1A is a top view of a prior art thin film transistor (TFT) array substrate, and FIG. 1B is a schematic cross-sectional view of the prior art TFT array substrate. For convenience to reveal features of the prior art, FIG. 1A illustrates only some portions of the structure, and a more detailed structure of the TFT array substrate is shown in FIG. 1B. Additionally, these structures are shown in a single cross-sectional view and divided by separating lines into regions A-A', B-B' and C-C' to depict cross-sectional structures along the section lines A-A', B-B' and C-C' of FIG. 1. The TFT array substrate 1 comprises a substrate 10, on which a display area 11 (the area indicated by the section line A-A') and a pad area 12 (the area surrounded by the dashed line) are defined. The pad area 12 further comprises a gate pad area 12a and a data pad area 12b (areas indicated by the section lines B-B' and C-C' respectively). A patterned first metal layer 13 disposed on the substrate 10 comprises a gate 131 disposed in the display area 11, a gate pad 132 disposed in the gate pad area 12a and a gate line 133 for connecting the gate 131 with the gate pad 132. A patterned first insulation layer 14 covers the substrate 10 and the patterned first metal layer 13. A patterned semiconductor layer 15 is disposed on the patterned first insulation layer 14 above the gate 131. A patterned second metal layer 16 is disposed on the patterned first insulation layer 14 in the display area 11, and covers portions of the patterned semiconductor layer 15. The patterned second metal layer 16 comprises a source 161 and a drain 162 disposed in the display area 11, a data pad 163 disposed in the data pad area 12b, and a data line 164 for connecting the source 161 with the data pad 163. All these connections are depicted in FIG. 1A. It should be appreciated that, the source 161 and the drain 162 are at least partially disposed on the patterned semiconductor layer 15 at two sides of the gate 131 respectively.

Further, a patterned second insulation layer 17 covers the display area 11, the gate pad area 12a and the data pad area 12b. It should be appreciated that, for convenience to draw a top view of FIG. 1B and for sake of description, the patterned second insulation layer 17 is omitted from depiction in FIG. 1A. Subsequently, a patterned planarization layer 18 is disposed on the patterned second insulation layer 17 in the display area 11.

FIG. 2 is a schematic view of the prior art TFT array substrate 1 using a half tone mask 24. During formation of the structure shown in FIG. 1B, through a photolithographic process using a half tone mask 24, openings 19', 20' and 21' are formed in the planarization layer 18'. Afterwards, by using the planarization layer 18' as a mask, the first insulation layer 14 and the second insulation layer 17 are etched to expose a portion of the drain 162 through a drain contact opening 19, and to expose a portion of the gate pad 132 and a portion of the data pad 163 through the first contact opening 20 and the second contact opening 21 respectively. Next, the planarization layer 18' is removed from the pad area 12 and a pixel electrode 22 is formed on the patterned planarization layer 18 to cover the drain contact opening 19 for electrical connection with the drain 162. A pad conduction layer 23 covering the first contact opening 20 and the second contact opening 21 is formed to electrically connect with the gate pad 132 and the data pad 163, thus completing the structure shown in FIG. 1B.

Unfortunately, the aforesaid structure has the following disadvantages. If the residue of the patterned planarization layer 18 in the gate pad area 12a and the data pad area 12b has an overlarge thickness, conductivity between the pad conduction layer 23 and other components or conductive layers attached thereon, for example, conductivity between the pad conduction layer 23 and a driving integrated circuit (IC), will be affected. Moreover, use of the half tone mask has strict requirements on uniformity control of the photolithographic process, causing increased difficulty in mass production.

In view of above, it is highly desirable in the art to provide a TFT array substrate for an LCD that can make the manufacturing process smoother and lower the production cost.

SUMMARY OF THE INVENTION

One objective of the present invention is to provide a method for manufacturing a thin film transistor array substrate that can advantageously simplify the manufacturing process. The manufacturing method of the present invention comprises the step of forming a patterned first metal layer in a transition area and a pad area and using portions of the patterned first metal layer as a data pad and a gate pad. Next, a patterned first insulation layer is formed, wherein the patterned first insulation layer at least comprises a first opening on the gate pad, a second opening on the data pad and a third opening on the patterned first metal layer in the transition area. With those portions of the patterned first insulation layer on the data pad and the gate pad having been removed, during a subsequent step of forming a patterned second insulation layer, openings on the gate pad and the data pad can be exposed by using a patterned planarization layer as a mask to etch at least a thickness of the patterned second insulation layer. As compared to the prior art, it is unnecessary for the manufacturing method of the present invention to use a complex manufacturing process involving a half tone mask additionally in order to form openings on the gate pad and the data pad. This saves both the production cost and time.

To this end, the present invention discloses a method for manufacturing a thin film transistor array substrate, comprising: providing a substrate, wherein the substrate defines a display area, a transition area and a pad area; forming a patterned first metal layer in the display area, the transition area and the pad area, wherein the patterned first metal layer includes a gate line and a gate electrode disposed in the display area, a data connecting line disposed in the transition area, and a data pad and a gate pad disposed in the pad area; forming a patterned first insulation layer to cover the substrate and the patterned first metal layer, and defining a first opening and a second opening in the pad area and a third opening in the transition area, wherein the first opening, the second opening and the third opening expose a portion of the gate pad, a portion of the data pad and a portion of the data connecting line respectively; forming a patterned semiconductor layer on the patterned first insulation layer above the gate electrode; and forming a patterned second metal layer on the patterned first insulation layer and covering a portion of the patterned semiconductor layer, wherein the patterned second metal layer includes a data line, a source electrode electrically connected to the data line and a drain electrode, and the data line is adapted to cover the third opening for electrical connection to the data connecting line.

Another objective of the present invention is to provide a thin film transistor array substrate for a liquid crystal display. One of the technical features of the thin film transistor array substrate is that, the thin film transistor array substrate comprises a gate pad and a data pad both formed of a patterned first metal layer, and the thin film transistor array substrate comprises a pad area in which only a patterned first insulation layer is disposed above the patterned metal layer.

To this end, the present invention discloses a thin film transistor array substrate for a liquid crystal display. The thin film transistor array substrate comprises a substrate, a patterned first metal layer, a patterned first insulation layer, a patterned semiconductor layer, a source electrode and a drain electrode, and a data line. The substrate defines a display area, a transition area and a pad area. The patterned first metal layer is disposed on the substrate and includes a gate line and a gate electrode in the display area, a data connecting line in the transition area and a data pad and a gate pad in the pad area. The patterned first insulation layer covers the substrate and the patterned first metal layer but exposes a portion of the gate pad for defining a first opening, exposes a portion of the data pad for defining a second opening and exposes a portion of the data connecting line for defining a third opening. The patterned semiconductor layer is disposed on the patterned first insulation layer above the gate electrode. The source electrode and the drain electrode are at least partially disposed on the patterned semiconductor layer at two sides of the gate electrode respectively. The data line is disposed on the patterned first insulation layer, wherein the data line covers the third opening for electrical connection to the data connecting line and electrical connection to the source electrode.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

The present invention relates to a thin film transistor array substrate for a flat panel display and a method for manufacturing the same, which eliminate need of a complex manufacturing process involving a half tone mask. In the following descriptions, the present invention will be explained with reference to embodiments thereof. However, these embodiments are not intended to limit the present invention to any specific environment, applications or particular implementations described in these embodiments. Therefore, descriptions of these embodiments are only for purpose of illustration rather than to limit the present invention. It should be appreciated that, in the following embodiments and the attached drawings, elements unrelated to the present invention are omitted from depiction; and dimensional relationships among individual elements are depicted on an exagerative scale for ease of understanding.

Figure 1A:
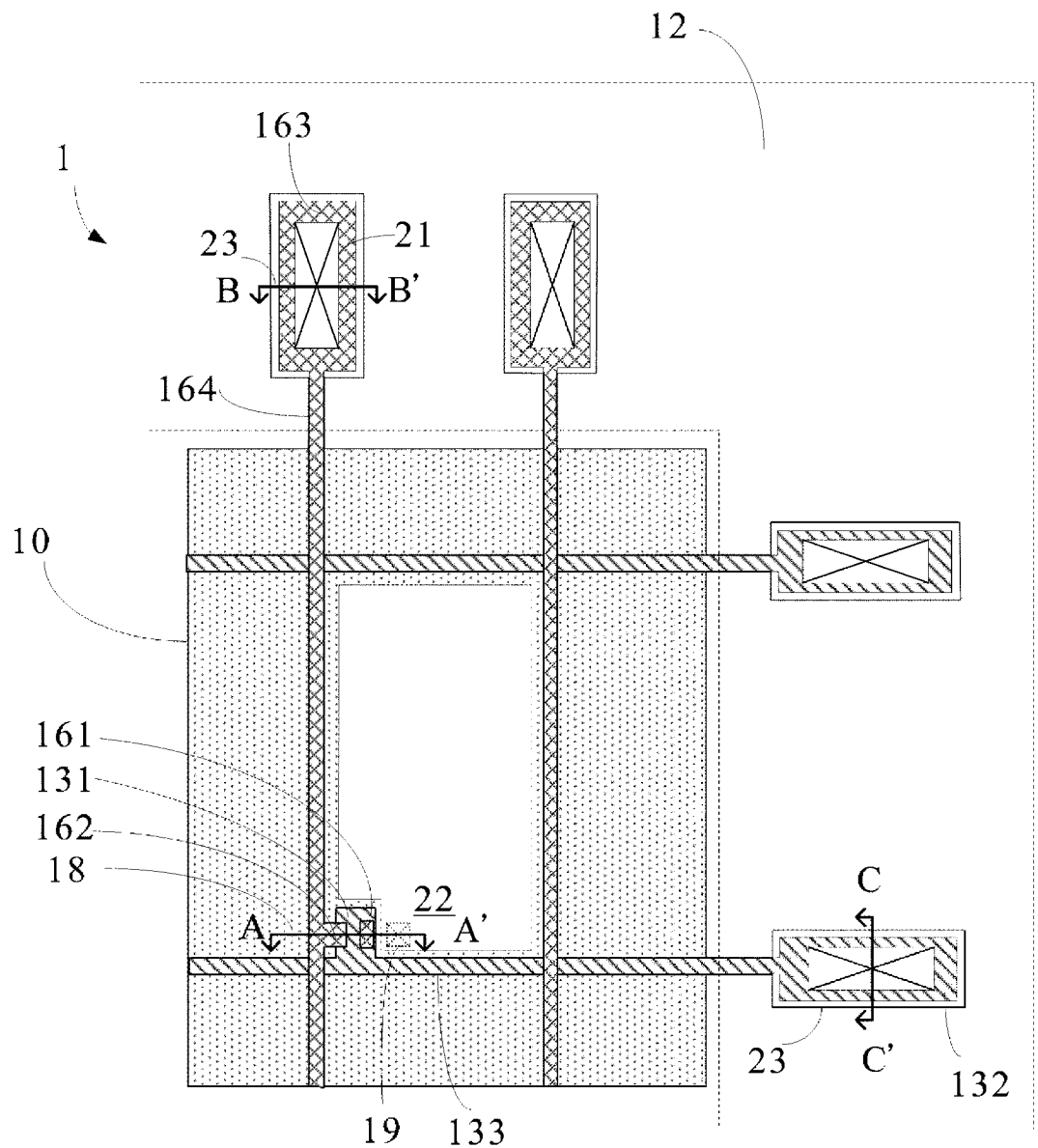
FIG. 1A is a top view of a prior art TFT array substrate.
Figure 1B:
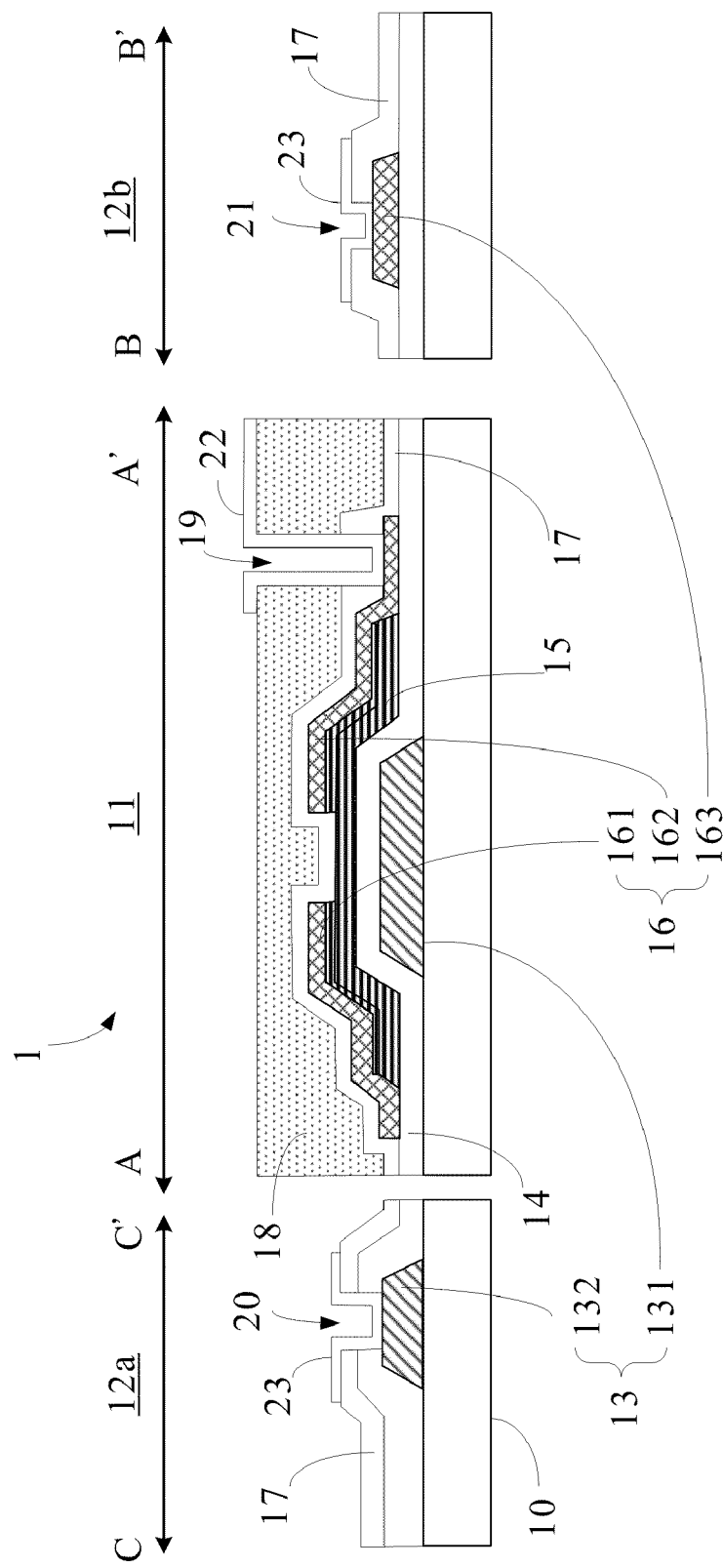
FIG. 1B is a schematic cross-sectional view of the prior art TFT array substrate.
Figure 2:
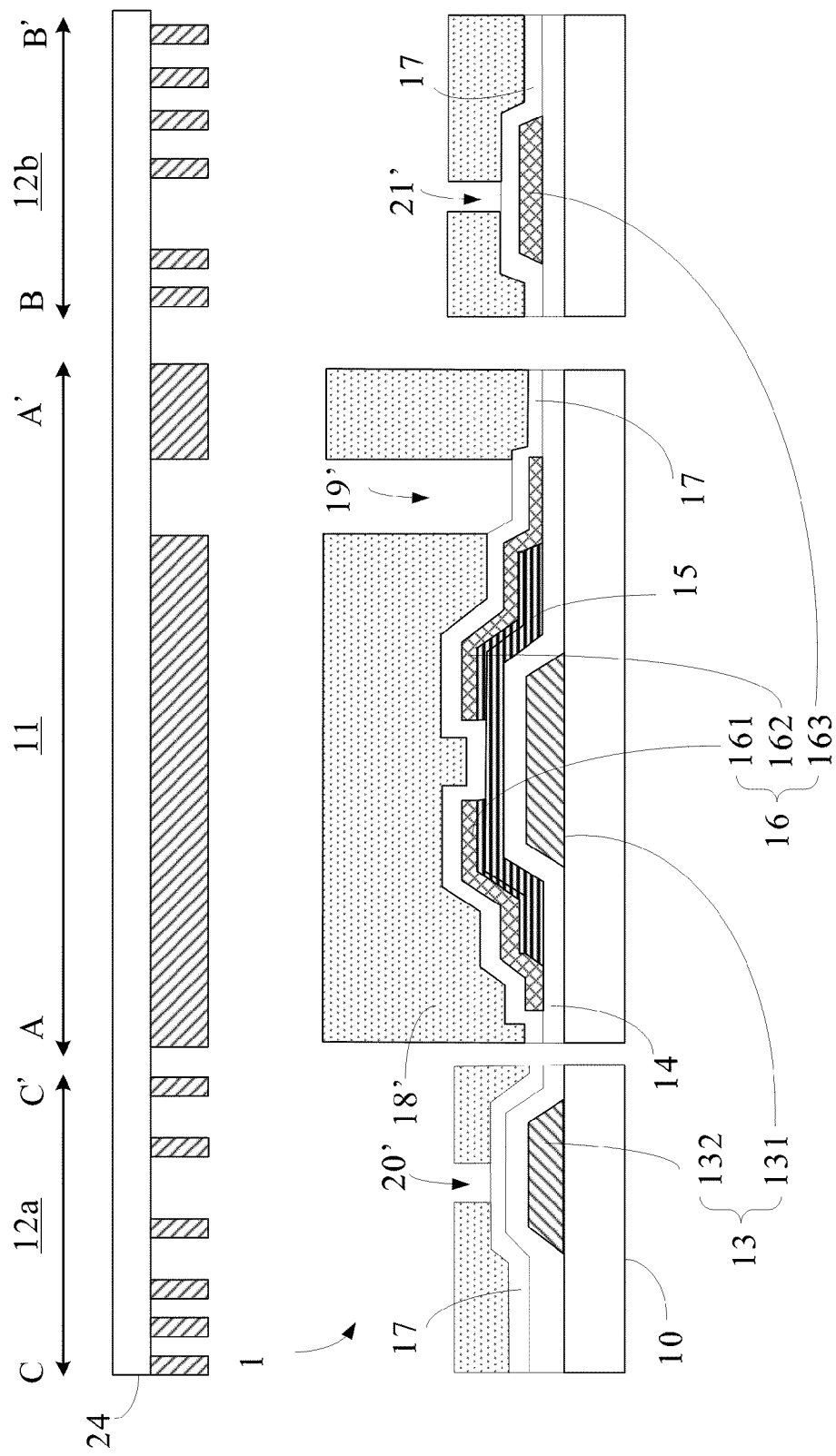
FIG. 2 is a schematic view of the prior art TFT array substrate using a half tone mask.
Figure 3A:
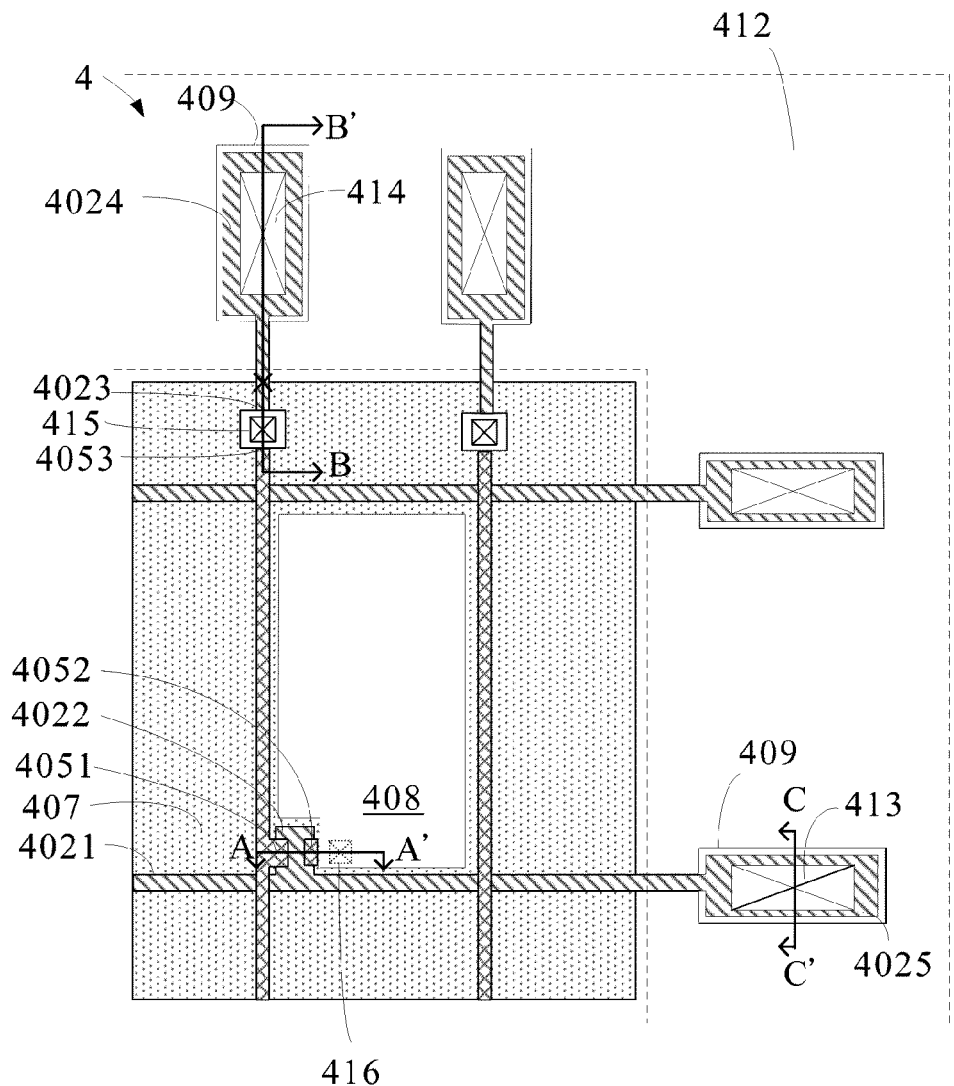
FIG. 3A is a top view of a TFT array substrate of the present invention.
Figure 3B:
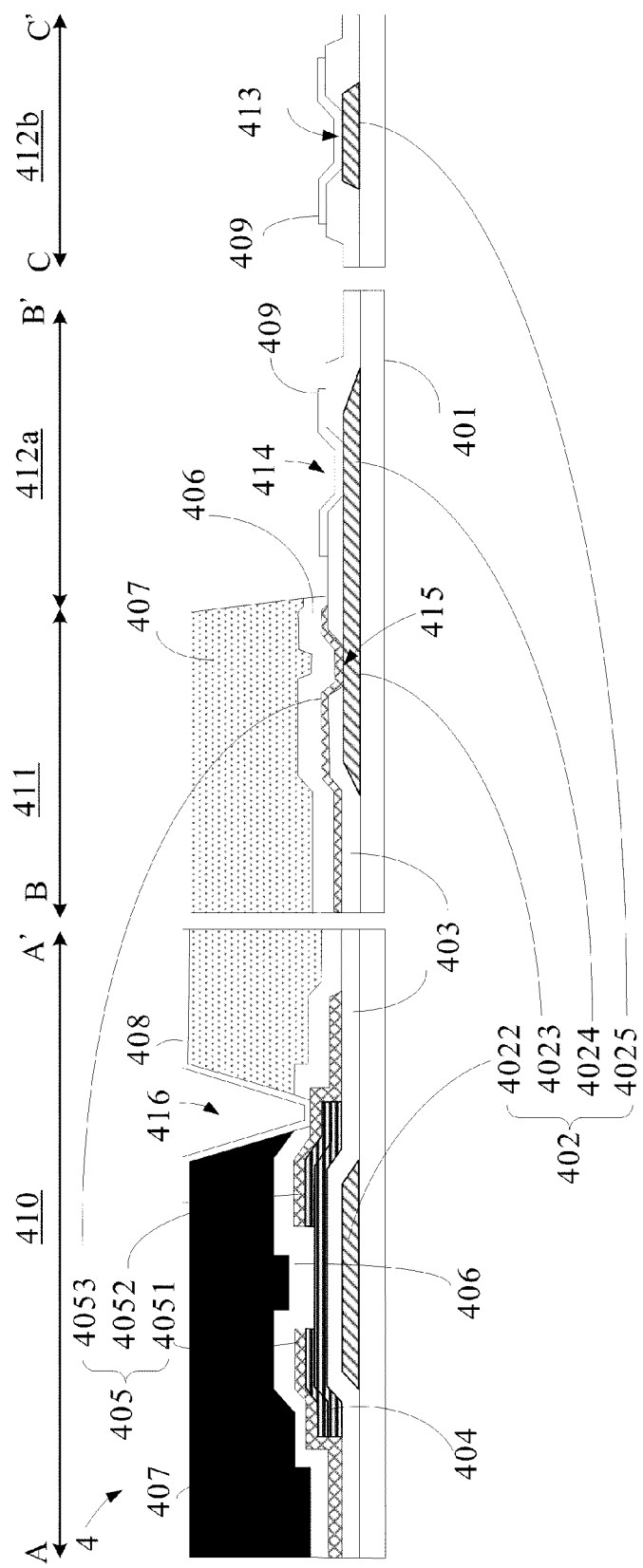
FIG. 3B is a schematic cross-sectional view of the TFT array substrate of the present invention.

FIGS. 3A and 3B are schematic views of a first embodiment of the present invention, in which FIG. 3A is a top view of a thin film transistor (TFT) array substrate and FIG. 3B is a schematic cross-sectional view of the TFT array substrate. For purpose of explanation, these structures are shown in a single cross-sectional view and divided by separating lines into regions A-A', B-B' and C-C' which are taken along the section lines A-A', B-B' and C-C' in FIG. 3A respectively. For convenience to reveal features of the present invention, FIG. 3A illustrates only some portions of the structure, and a more detailed structure of the TFT array substrate is shown in FIG. 3B. The TFT array substrate 4 of the first embodiment, which is adapted for use in a liquid crystal display (LCD), comprises a substrate 401, a patterned first metal layer 402, a patterned first insulation layer 403, a patterned semiconductor layer 404, a patterned second metal layer 405, a patterned second insulation layer 406, a patterned planarization layer 407, a pixel electrode 408 and a pad conductive layer 409.

The substrate 401 defines a display area 410 (the area indicated by the section line A-A'), a transition area 411 and a pad area 412 (the area surrounded by the dashed line), wherein the pad area 412 comprises a data pad area 412a and a gate pad area 412b (areas indicated by the section lines B-B' and C-C' respectively). It should be appreciated that, the pad area 412 refers broadly to areas where pads exist, and in this embodiment, refers to areas other than the display area 410 and the transition area 411. The transition area 411 and the data pad area 412a are depicted along the section line B-B', and the transition area 411 is disposed between about the data pad 4024 and the display area 410 mainly for purpose to electrically connect the patterned first metal layer 402 with the patterned second metal layer 405. The patterned first metal layer 402 disposed on the substrate 401 comprises a gate line 4021 and a gate electrode 4022 in the display area 410, a data connecting line 4023 in the transition area 411, a data pad 4024 in the data pad area 412a, and a gate pad 4025 in the gate pad area 412b.

Further, the patterned first insulation layer 403 covers the substrate 401 and the patterned first metal layer 402 in such a way that a portion of the gate pad 4025 is exposed to define a first opening 413, a portion of the data pad 4024 is exposed to define a second opening 414 and a portion of the data connecting line 4023 is exposed to define a third opening 415. The patterned semiconductor layer 404 is disposed on the patterned first insulation layer 403 above the gate electrode 4022. The patterned second metal layer 405 comprises a source electrode 4051, a drain electrode 4052 and a data line 4053. The source electrode 4051 and the drain electrode 4052 are at least partially disposed on the patterned semiconductor layer 404 at two sides of the gate electrode 4022 respectively. The data line 4053 is disposed on the patterned first insulation layer 403. It should be particularly noted that, as can be seen from FIG. 3B, the data line 4053 covers the third opening 415 for electrical connection with the data connecting line 4023 and, as can be seen from FIG. 3A, the data line 4053 electrically connects to the source electrode 4051.

The patterned second insulation layer 406 covers the display area 410 and the transition area 411, and the patterned planarization layer 407 is in turn disposed on the patterned second insulation layer 406. A drain contact opening 416 is formed through the patterned second insulation layer 406 and the patterned planarization layer 407 to expose a portion of the drain electrode 4052. The pixel electrode 408 is disposed on the patterned planarization layer 407 and covers the drain contact opening 416 for electrical connection with the drain electrode 4052. The pad conductive layer 409 is adapted to cover the first opening 413 and the second opening 414 so as to be electrically connected to the gate pad 4025 and the data pad 4024 through the first opening 413 and the second opening 414 respectively.

As can be seen from FIG. 3A, the data line 4053 is electrically connected to the source electrode 4051, and as can be seen from FIG. 3B, the data line 4053 covers the third opening 415 in the transition area 411 and is electrically connected to the data connecting line 4023, from where it is further electrically connected to the data pad 4024. It should be appreciated that, both the data pad 4024 in the data pad area 412a and the gate pad 4025 in the gate pad area 412b belongs to the patterned first metal layer 402.

Next, characteristics of the patterned second insulation layer 406 of this embodiment will be further described. Generally, in contrast to the patterned second insulation layer 406 which is made of silicon nitride, i.e., an inorganic material, the patterned planarization layer 407 is generally made of a photosensitive organic material such as acrylic resins. However, as compared to inorganic materials of the insulation layer such as silicon nitride, silicon oxide or silicon oxynitride, such an organic material demonstrates a poorer ion or water vapor blocking effect, so subsequent to formation of switch elements of the TFT array, a patterned second insulation layer 406 made of an inorganic material will be formed between the patterned planarization layer 407 and the patterned semiconductor layer 404 to enhance the blocking effect.

Unlike the prior art where the second metal layer 16 comprises the data pad 163, the data pad area 412a of the present invention is not formed with the patterned second insulation layer 406 and the patterned second metal layer 405 and, meanwhile, the gate pad area 412b is not formed with the patterned second insulation layer 406. This may significantly decrease the thickness of the pad area 412, make the surface of the whole structure more planar and allow the whole pad area 412 to be formed of a same metal layer (which is the patterned first metal layer 402 in this embodiment), all of which help to improve the yield of subsequent processes.

FIGS. 4A through 4G are schematic views illustrating a flow process of a method for manufacturing a TFT array substrate according to a second embodiment of the present invention. The flow process of the manufacturing method of the present invention will now be described with reference to the structure discussed in the first embodiment. For ease of understanding, elements in FIGS. 4A through 4H bearing the same reference numerals as those of the previous embodiment will represent the same element structures.

Figure 4A:
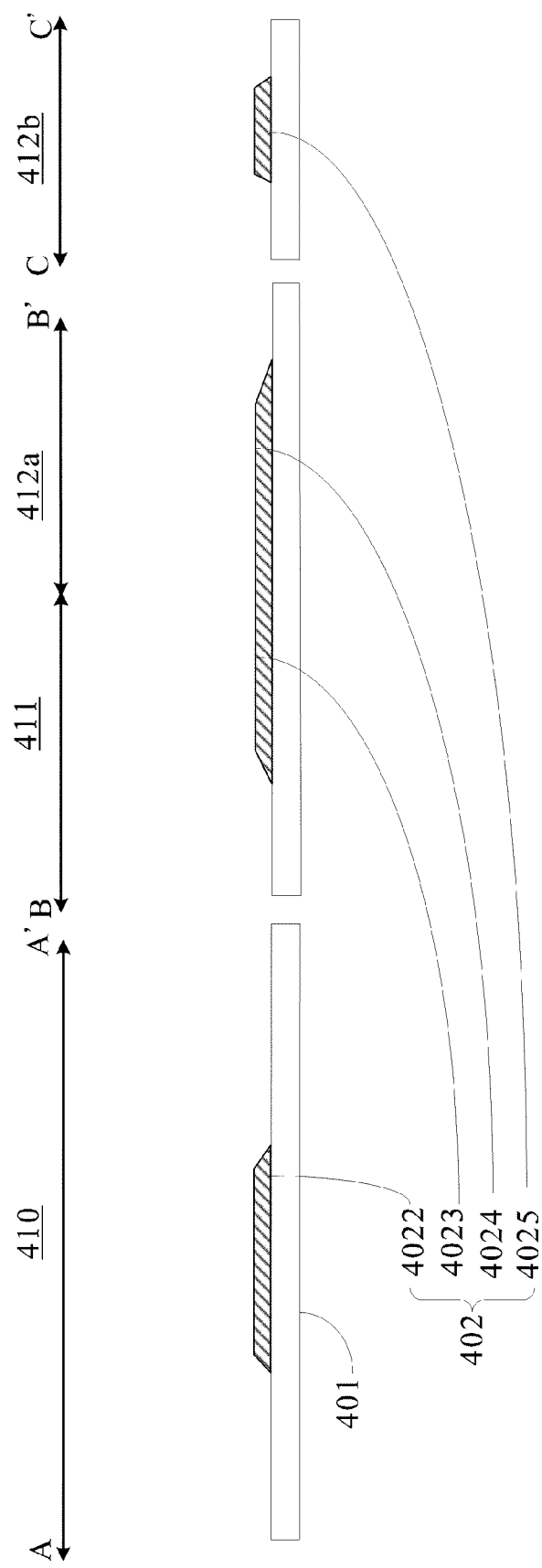
FIGS. 4A through 4G are schematic views illustrating a flow process of a method for manufacturing a TFT array substrate in a fourth embodiment of the present invention.

Referring to FIG. 4A, a substrate 401 is provided. The substrate 401 defines a display area 410, a transition area 411, and a pad area 412 including a data pad area 412a and a gate pad area 412b. A patterned first metal layer 402 is formed in the display area 410, the transition area 411, the data pad area 412a and the gate pad area 412b. The patterned first metal layer 402 comprises a gate line 4021 (see FIG. 3A) and a gate electrode 4022 in the display area 410, a data connecting line 4023 in the transition area 411, and a data pad 4024 and a gate pad 4025 in the pad area 412.

Figure 4B:
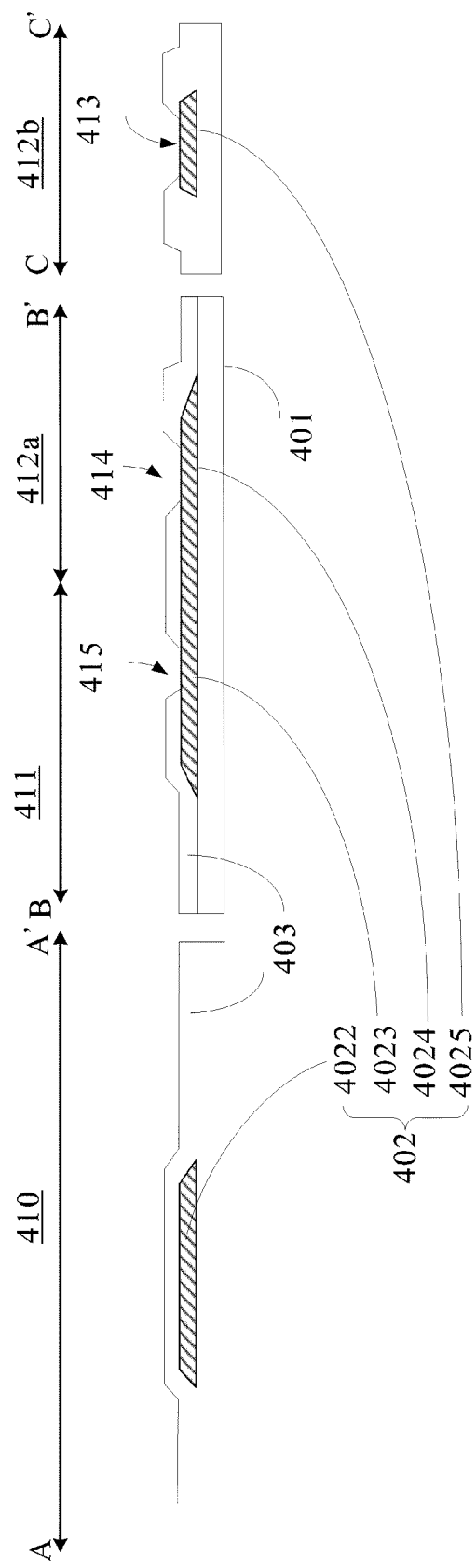

FIG. 4B depicts that a patterned first insulation layer 403 is formed to cover the substrate 401 and the patterned first metal layer 402 and define a first opening 413 and a second opening 414 in the pad area 412 and a third opening 415 in the transition area 411. The first opening 413, the second opening 414 and the third opening 415 expose a portion of the gate pad 4025, a portion of the data pad 4024 and a portion of the data connecting line 4023 respectively.

Figure 4C:
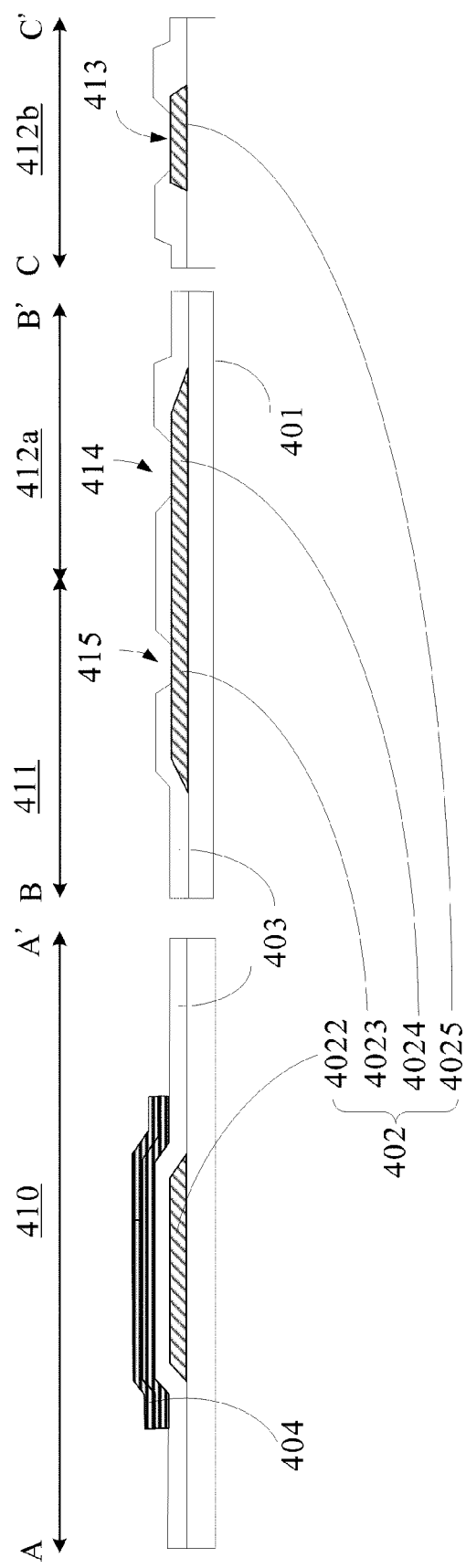

FIG. 4C depicts that a patterned semiconductor layer 404 is formed on the patterned first insulation layer 403 above the gate electrode 4022.

Figure 4D:
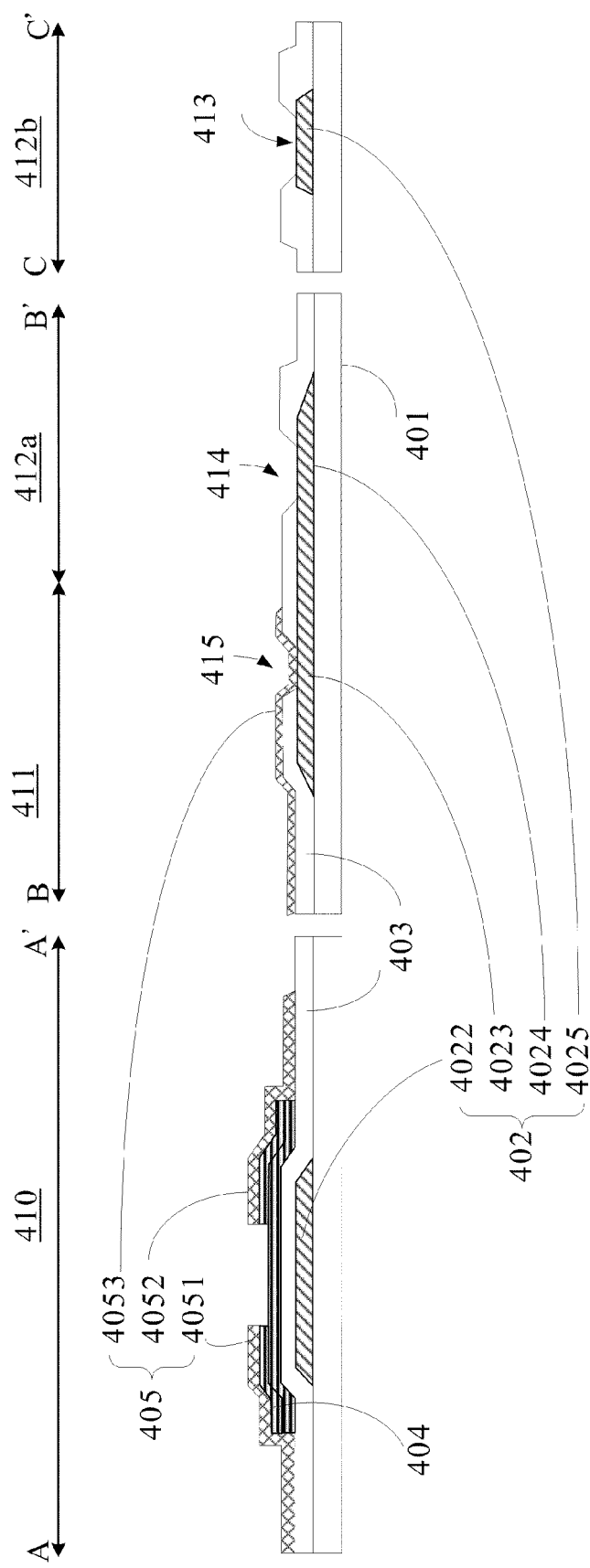

FIG. 4D depicts that a patterned second metal layer 405 is formed on the patterned first insulation layer 403 and covers some portions of the patterned semiconductor layer 404. The patterned second metal layer 405 comprises a data line 4053, a source electrode 4051 electrically connected to the data line 4053 and a drain electrode 4052, in which the data line 4053 covers the third opening 415 for electrical connection to the data connecting line 4023.

Figure 4E:
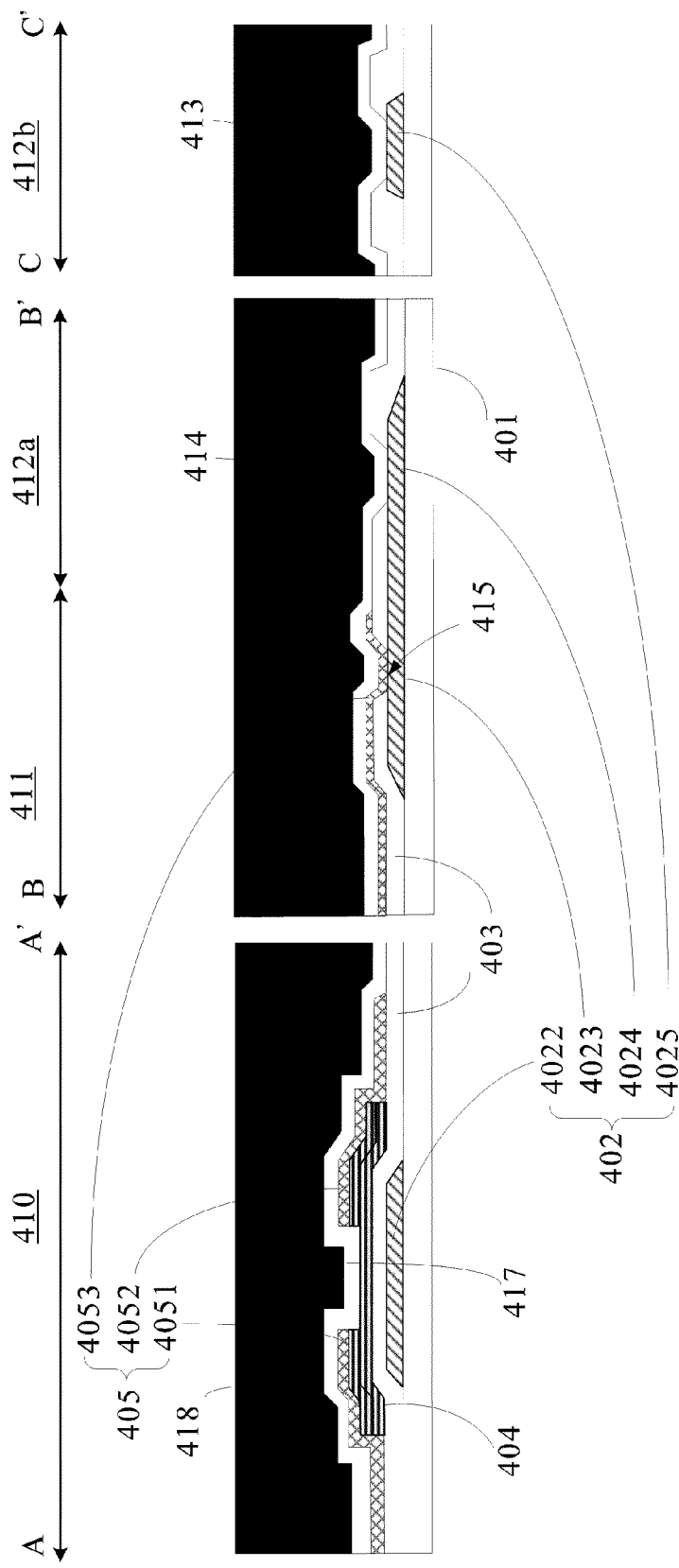
Figure 4F:
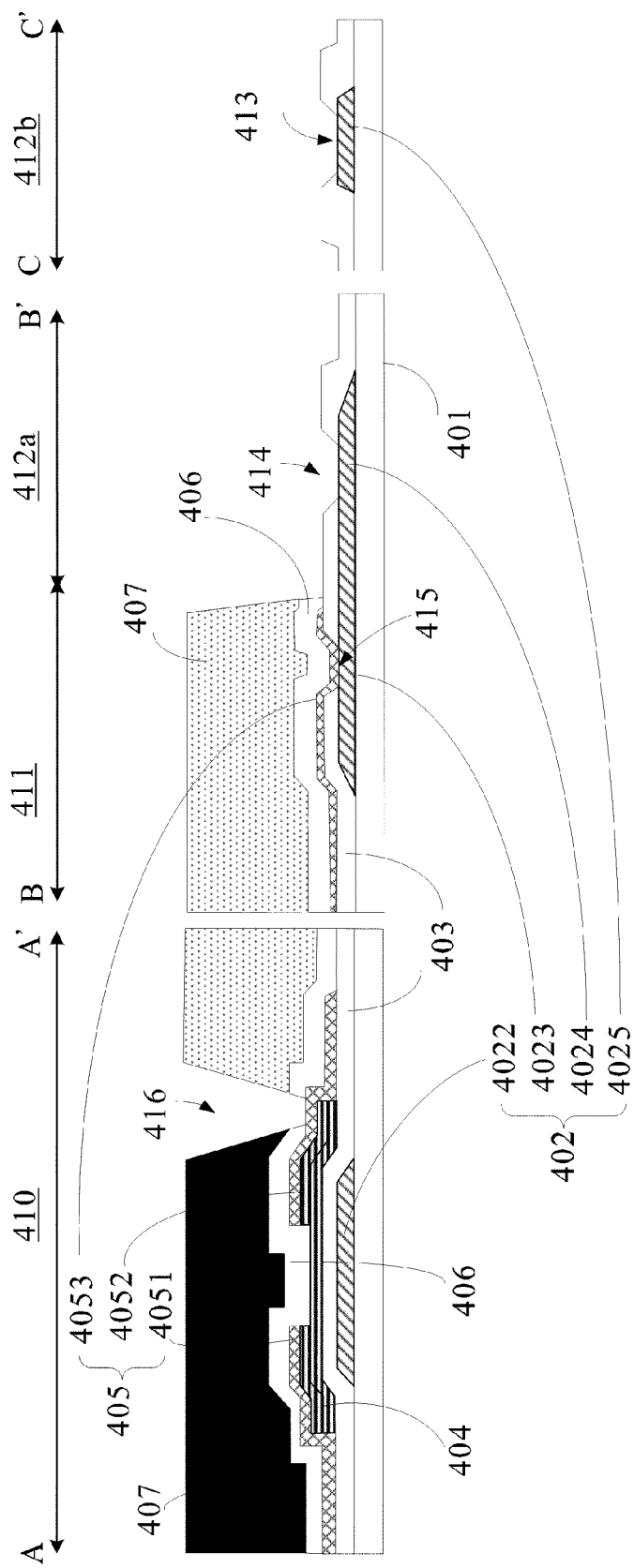

FIG. 4E depicts that a second insulation layer 417 and a planarization layer 418 are formed broadly through deposition to cover each area of the TFT array substrate. FIG. 4F depicts that a patterned second insulation layer 406 and a patterned planarization layer 407 are formed. A drain contact opening 416 is formed through the patterned second insulation layer 406 and the patterned planarization layer 407 to expose a portion of the drain electrode 4052. The patterned second insulation layer 406 has a first opening 413 and a second opening 414 for exposing a portion of the gate pad 4025 and a portion of the data pad 4024 respectively.

Figure 4G:
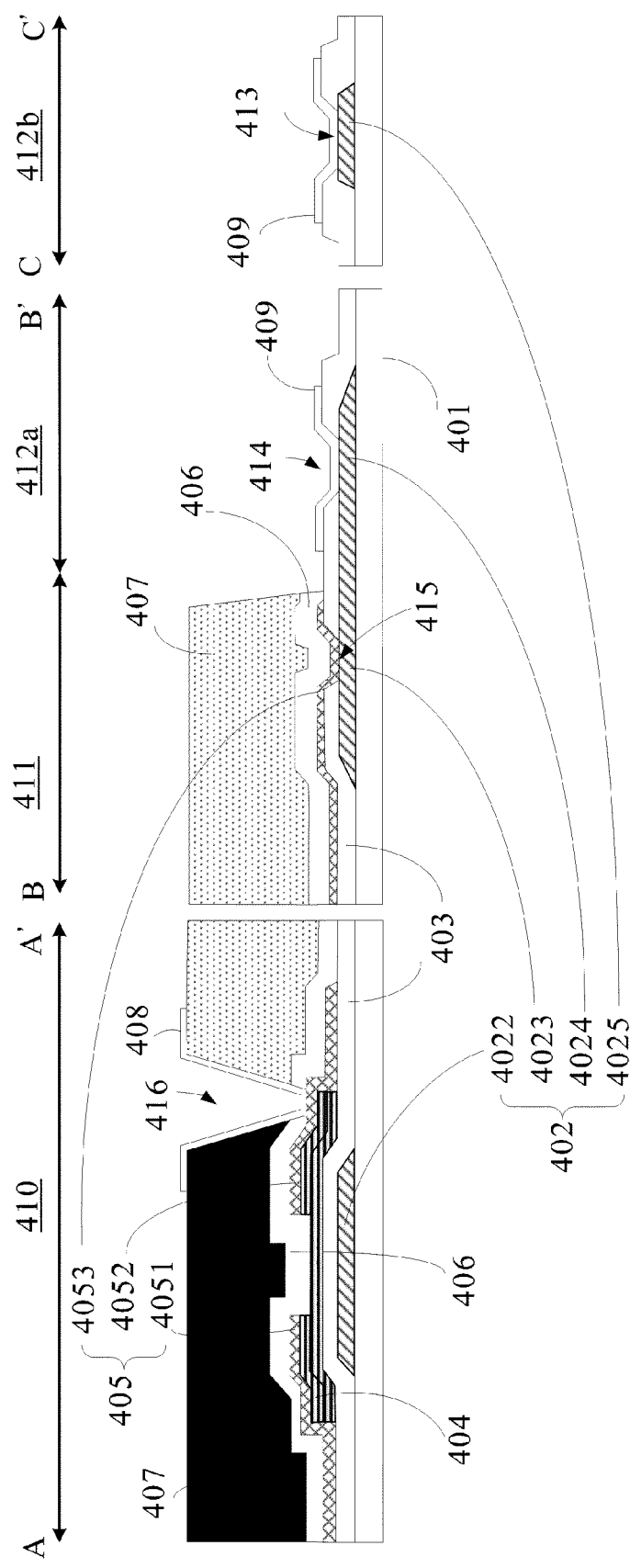

FIG. 4G depicts that a patterned transparent conductive layer is formed on the patterned planarization layer. The patterned transparent conductive layer comprises a pixel electrode 408 and a pad conductive layer 409 for covering the exposed portion of the drain electrode 4052 as well as the first opening 413 and the second opening 414. Thus, the structure of the TFT array substrate described in the first embodiment is completed.

Figure 5:
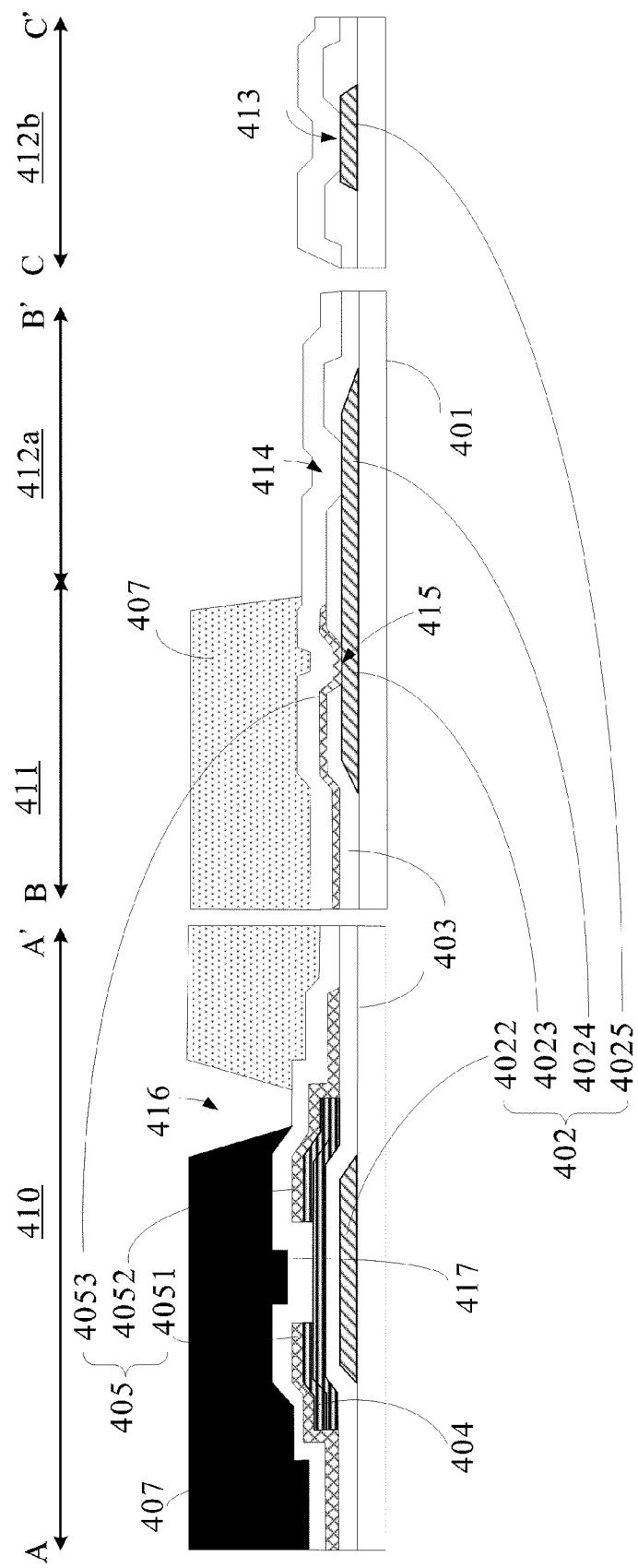
FIG. 5 is a schematic view illustrating a flow process of a method for forming a patterned second insulation layer by using a patterned planarization layer as a mask.

It is worth noting that, the patterned second insulation layer 406 may be formed by using the patterned planarization layer 407 as a mask. FIG. 5 is a schematic view illustrating how to form the patterned second insulation layer 406 by using the patterned planarization layer 407 as a mask. First, the planarization layer 418 is patterned to form a patterned planarization layer 407 in the display area 410, the pad area 412 and the transition area 411. Afterwards, by using the patterned planarization layer 407 as a mask, the second insulation layer 417 is etched to expose the gate pad 4025 and the data pad 4024 and to form the drain contact opening 416 for exposing the drain electrode 4052, thereby obtaining the structure as shown in FIG. 6F. In this embodiment, the second insulation layer 417 and the planarization layer 418 in the pad area 412 are removed completely.

Figure 6A:
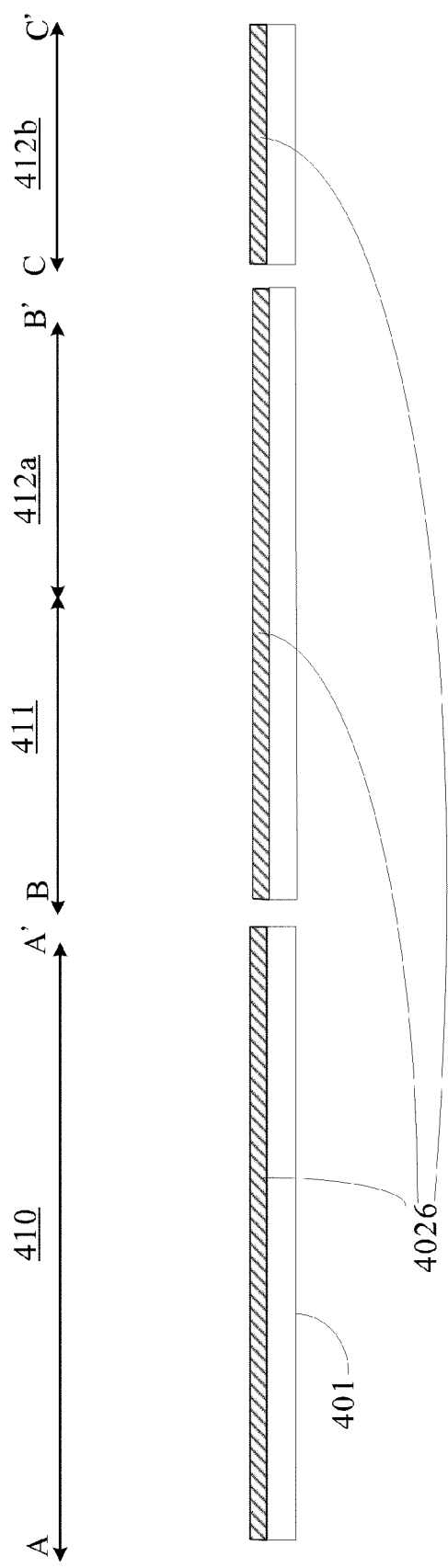
FIGS. 6A through 6D depict a flow process of forming a patterned first metal layer according to the present invention.
Figure 6B:
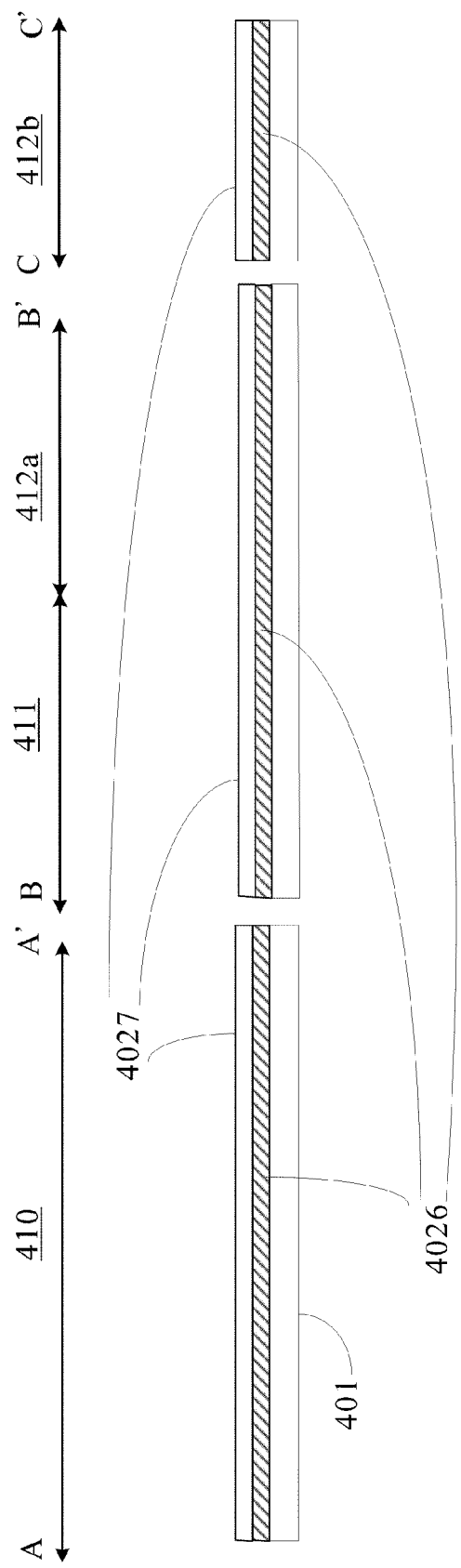
Figure 6C:
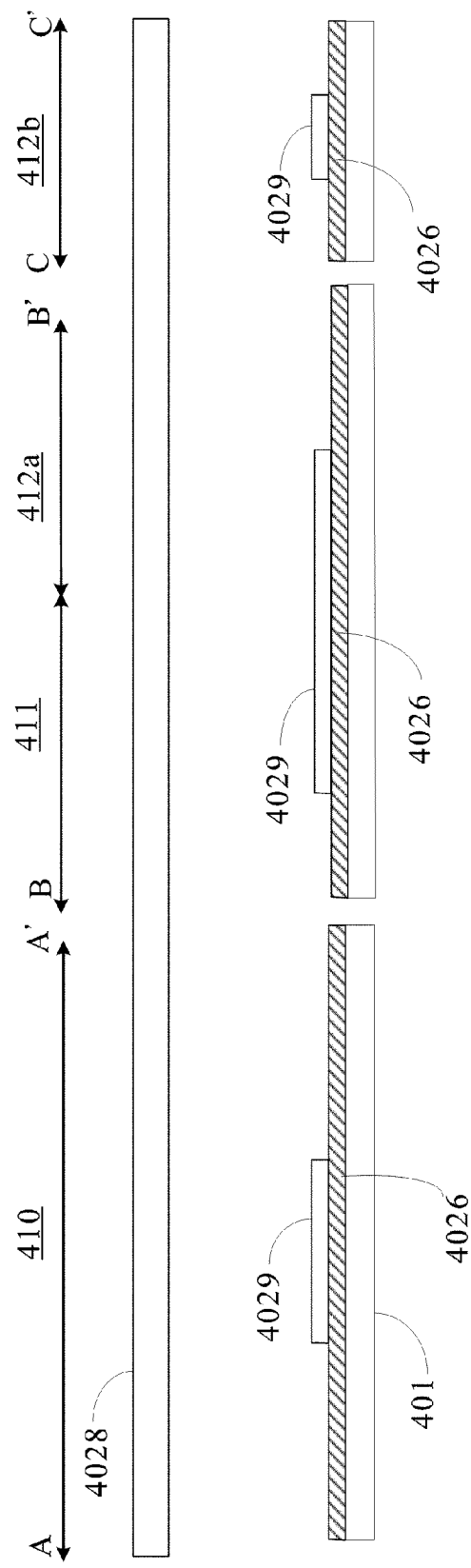
Figure 6D:
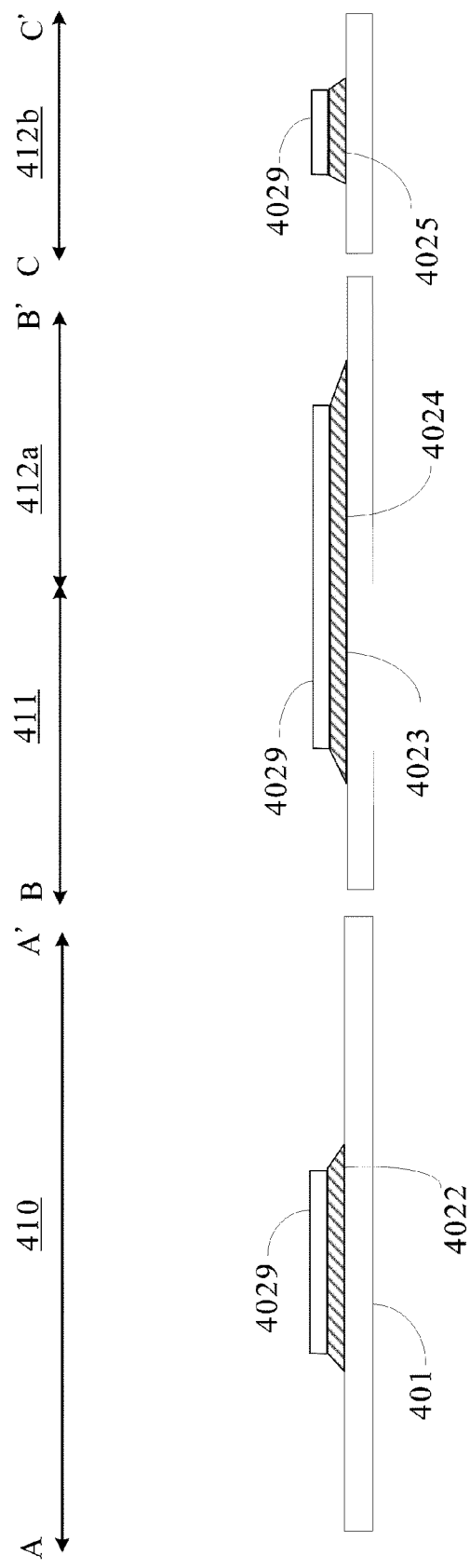

FIGS. 6A through 6D further illustrate a flow process of forming the aforesaid patterned first metal layer 4026. Referring first to FIG. 6A, a first metal layer 4026 is formed on the substrate 401. Referring next to FIG. 6B, a first photo-resist layer 4027 is formed on the first metal layer 4026. Referring to FIG. 6C, a patterned first photo-resist layer 4029 is formed on the first metal layer 4026 by means of a photo mask 4028. Referring to FIG. 6D, the first metal layer 4026 is etched through the patterned first photo-resist layer 4029, leaving portions of the first metal layer 4026 in the display area 410 to form the gate line 4021 (as shown in FIG. 3A) and the gate electrode 4022 electrically connected to the gate line 4021, leaving a portion of the first metal layer 4026 in the gate pad area 412b to form the gate pad 4025 at an end of the gate line 4021, leaving a portion of the first metal layer 4026 in the data pad area 412a to form the data pad 4024, and leaving a portion of the first metal layer 4026 in the transition area 411 to form the data connecting line 4023. Afterwards, the patterned first photo-resist layer 4029 is removed to form the patterned first metal layer 402 as shown in FIG. 4A. It should be particularly noted that, the above descriptions are only provided to illustrate formation of the patterned first metal layer 402 but not to limit the present invention, and upon reviewing the present disclosure, those skilled in the art of semiconductor manufacturing may fabricate the patterned first metal layer 402 in other similar approaches within the scope of the present invention.

Figure 7A:
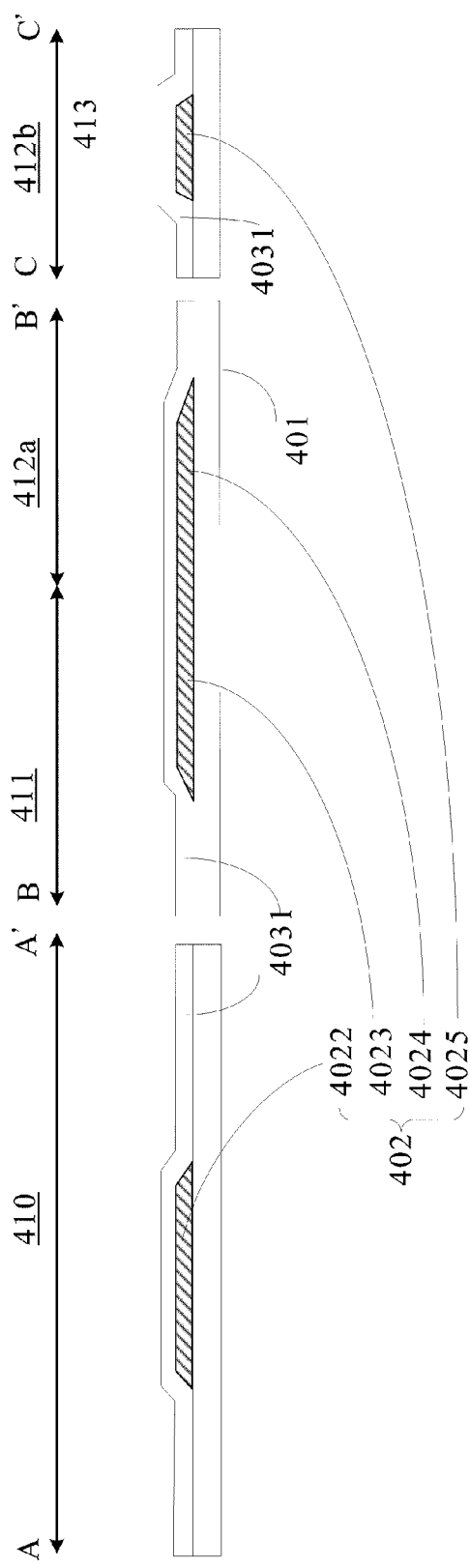
FIGS. 7A through 7D depict a flow process of forming a patterned first insulation layer according to the present invention.
Figure 7B:
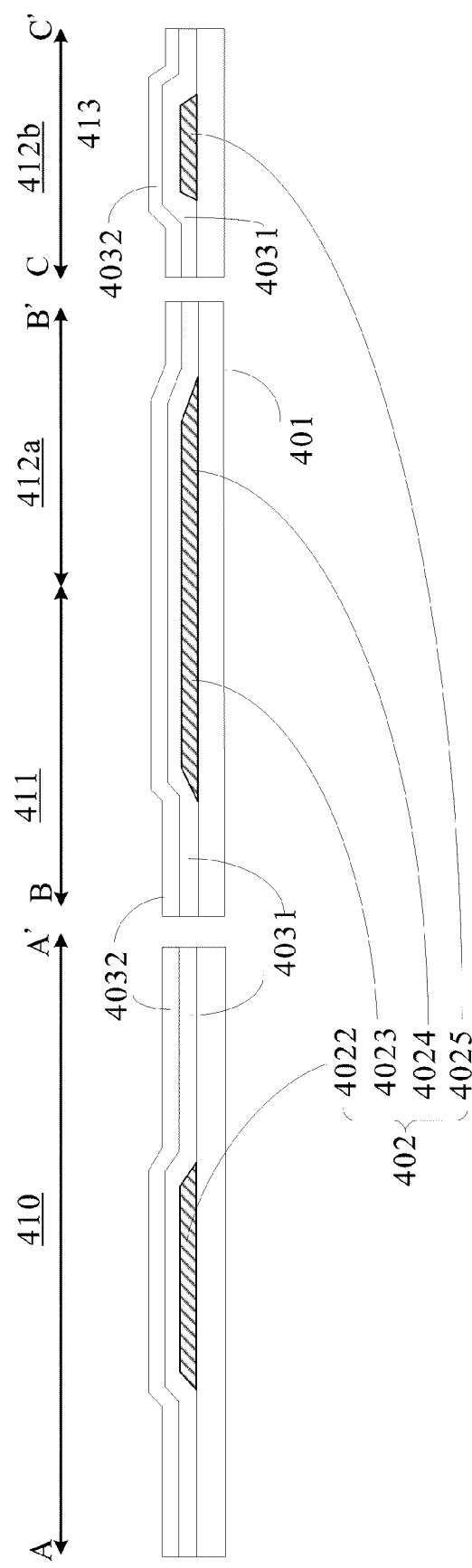
Figure 7C:
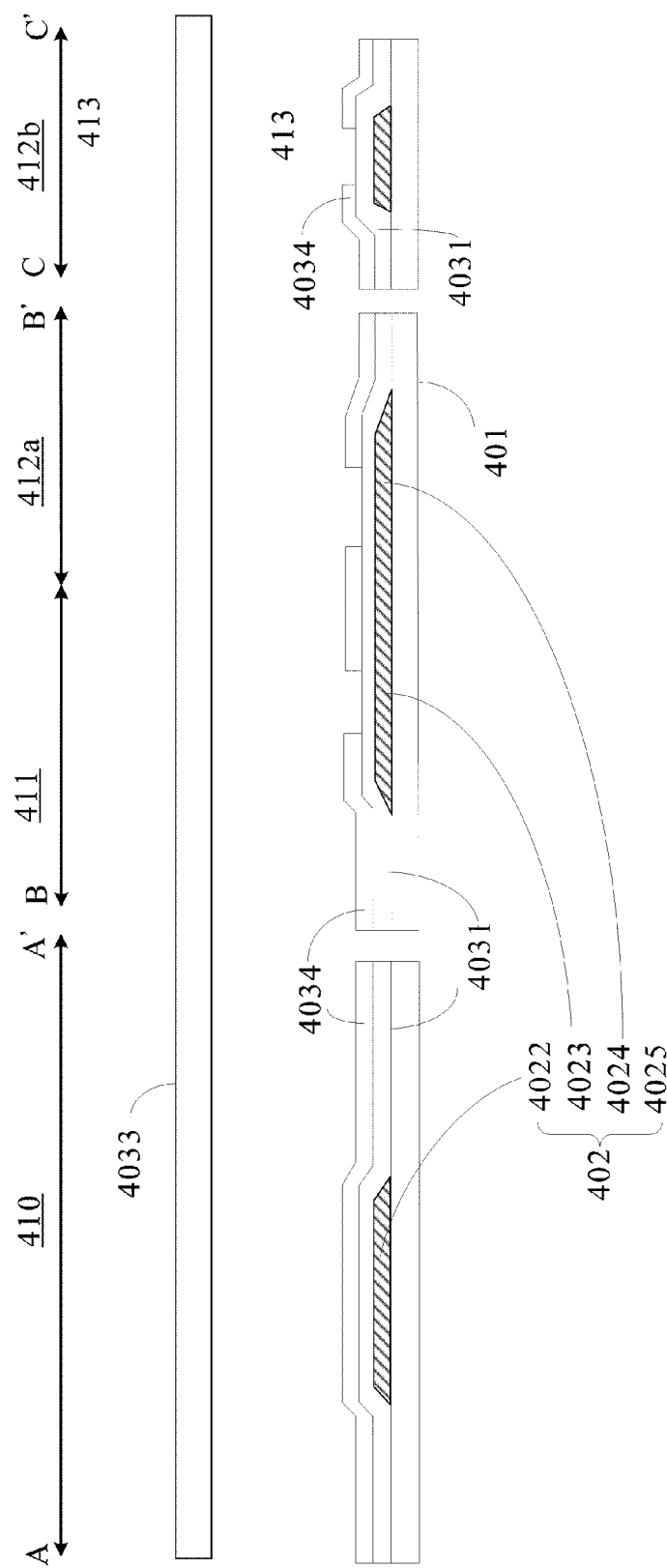
Figure 7D:
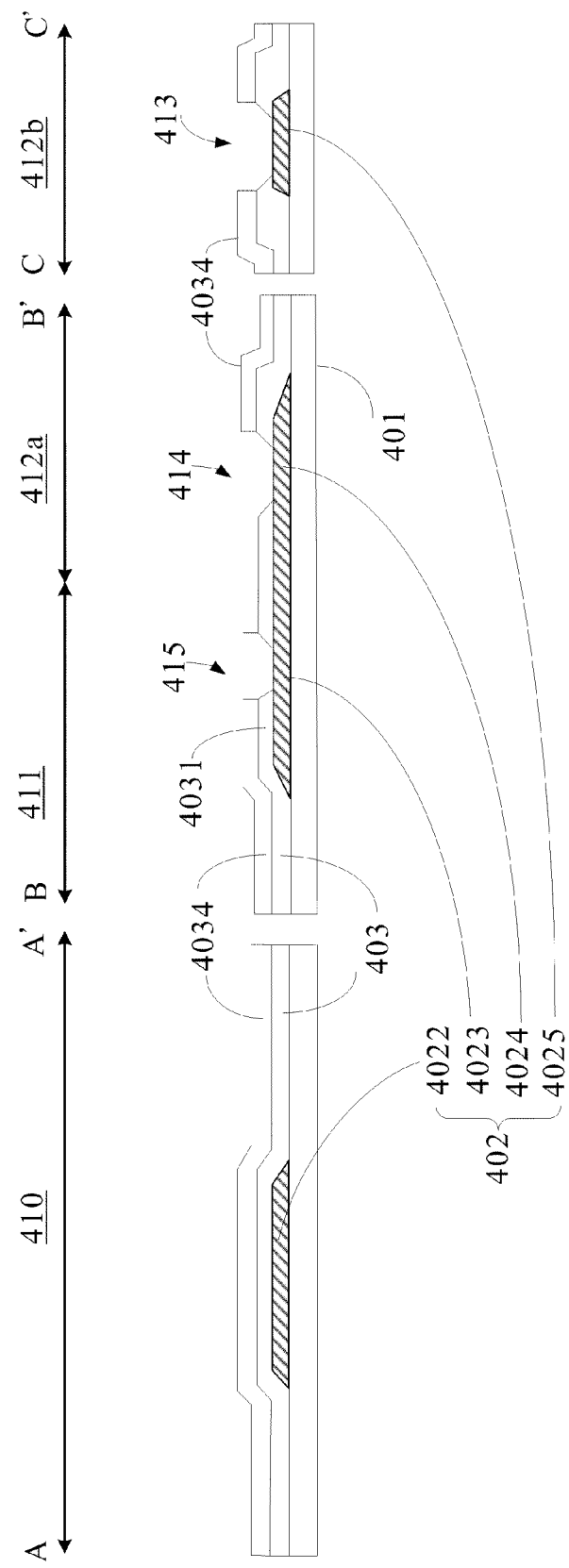

FIGS. 7A through 7D further illustrate a flow process of forming the aforesaid patterned first insulation layer 403. Referring first to FIG. 7A, a first insulation layer 4031 is formed in the display area 410, the transition area 411, as well as the data pad area 412a and the gate pad area 412b of the pad area 412 to cover the substrate 401 and the patterned first metal layer 402. Referring next to FIG. 7B, a second photo-resist layer 4032 is formed on the first metal layer 4026. Referring to FIG. 7C, through a photo mask 4033, a patterned second photo-resist layer 4034 is formed on the first insulation layer 4031. Referring further to FIG. 7D, through the patterned second photo-resist layer 4034, the first insulation layer 4031 is etched to form and define a first opening 413 in the gate pad area 412b of the pad area 412, form and define a second opening 414 in the data pad area 412a of the pad area 412, and form and define a third opening 415 in the transition area 411. The first opening 413, the second opening 414 and the third opening 415 expose a portion of the gate pad 4025, a portion of the data pad 4024 and a portion of the data connecting line 4023 respectively. Finally, the patterned second photo-resist layer is removed to form the patterned first insulation layer 403 as shown in FIG. 4B. It should be particularly noted that, the above descriptions are only provided to illustrate formation of the patterned first insulation layer 403 but not to limit the present invention, and upon reviewing the present disclosure, those skilled in the art of semiconductor manufacturing may fabricate the patterned first insulation layer 403 in other similar approaches within the scope of the present invention.

Figure 8A:
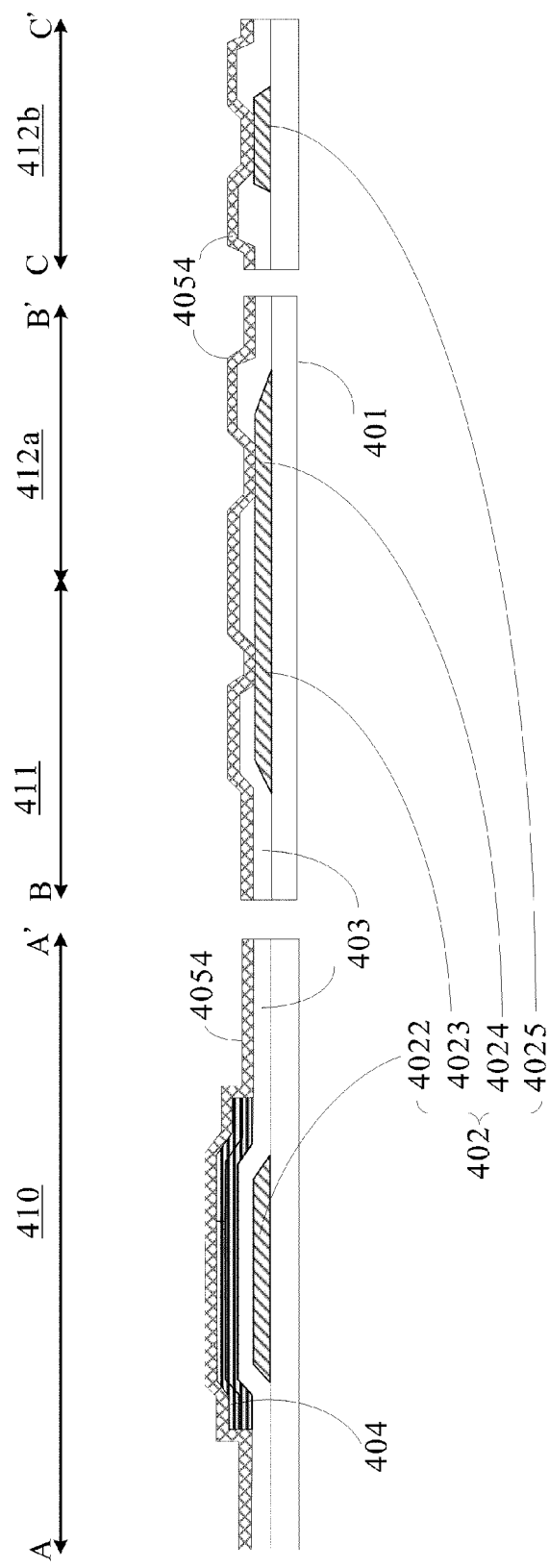
FIGS. 8A through 8D depict a flow process of forming a patterned second metal layer according to the present invention.
Figure 8B:
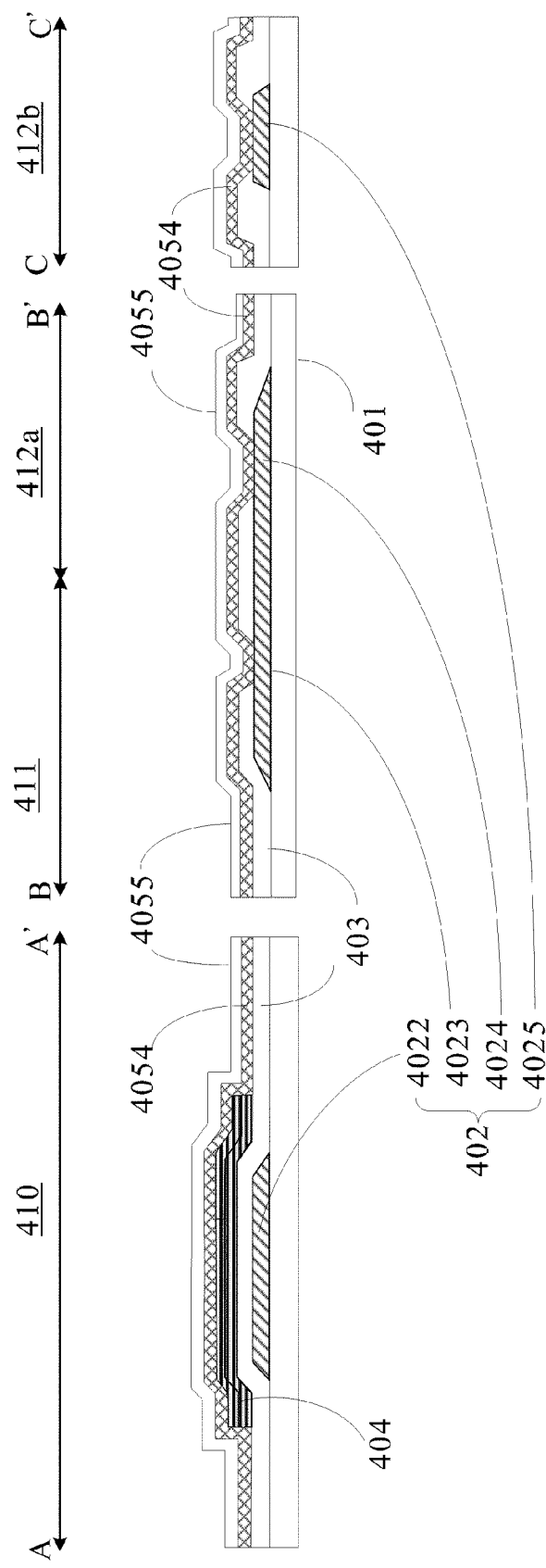
Figure 8C:
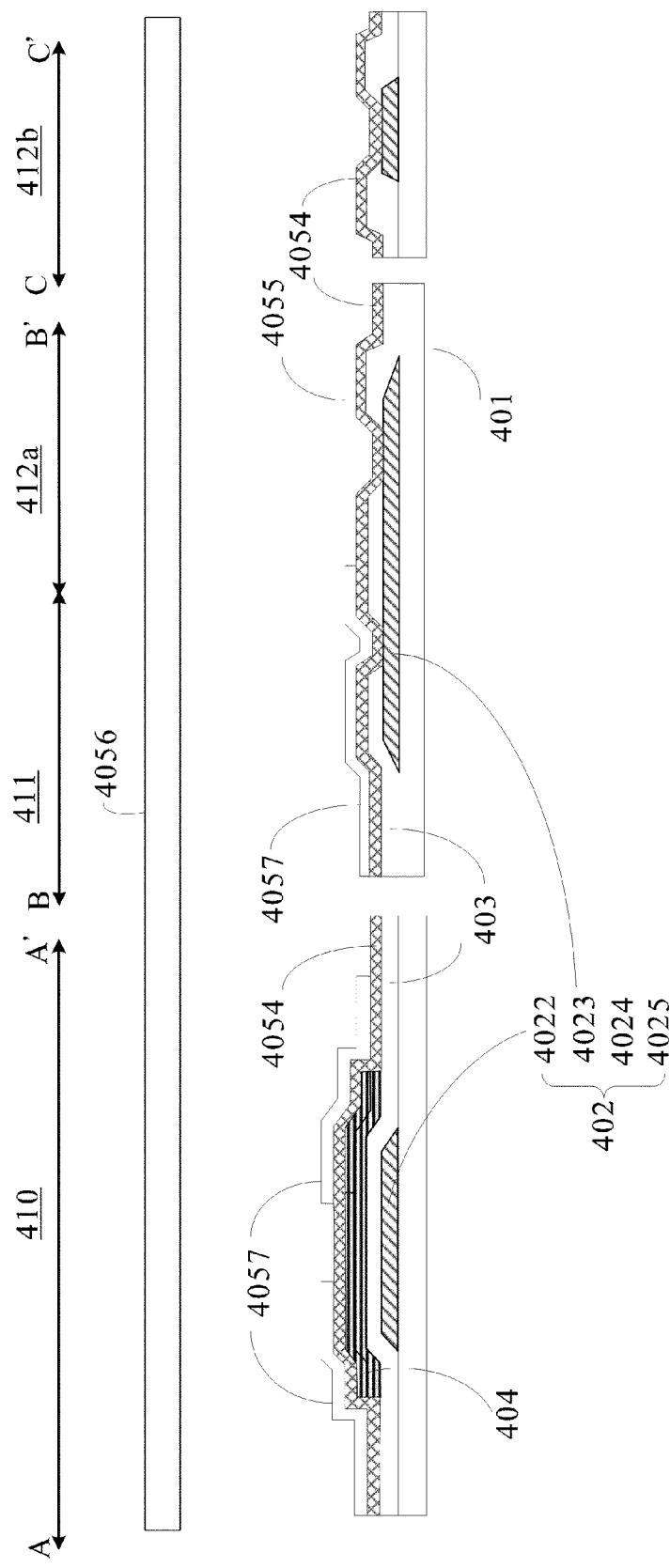
Figure 8D:
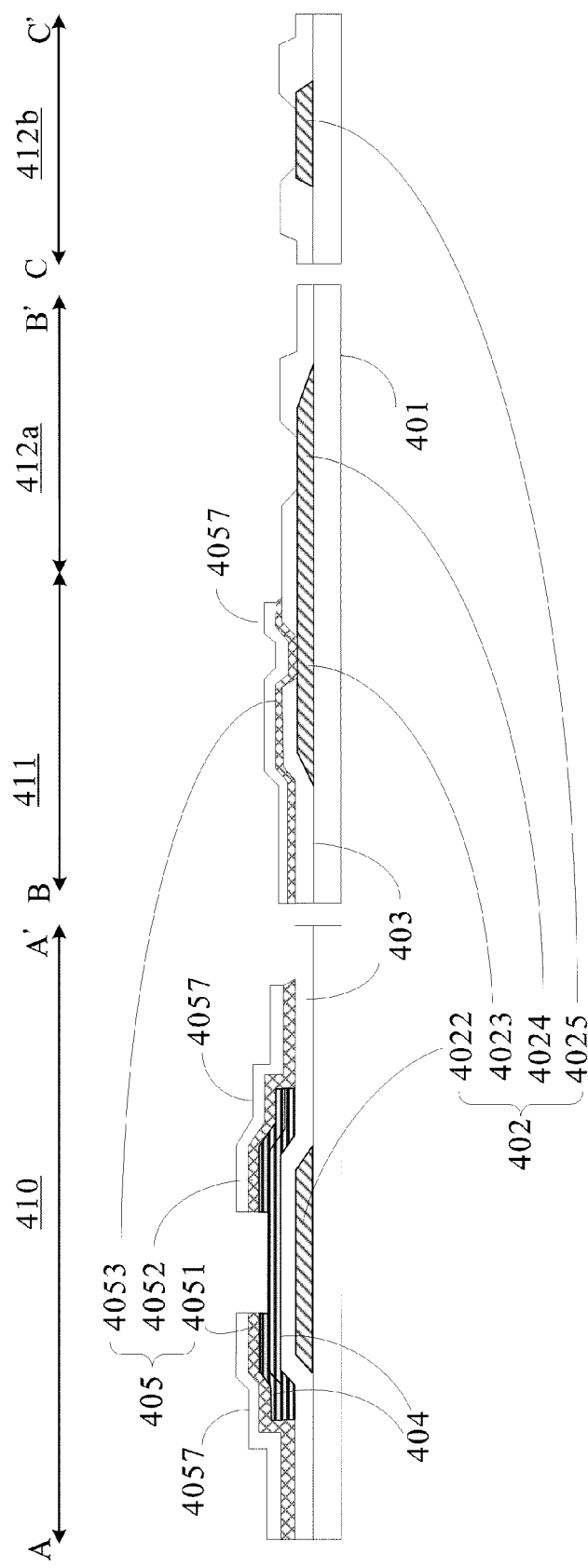

FIGS. 8A through 8D further illustrate a flow process of forming the aforesaid patterned second metal layer 405. Referring first to FIG. 8A, a second metal layer 4054 is formed on the patterned first insulation layer 403 in the display area 410, the transition area 411, as well as the data pad area 412a and the gate pad area 412b of the pad area 412. Referring next to FIG. 8B, a third photo-resist layer 4055 is formed on the second metal layer 4054. Referring to FIG. 8C, through a photo mask 4056, a patterned third photo-resist layer 4057 is formed on the second metal layer 4054. Referring further to FIG. 8D, through the patterned third photo-resist layer 4057, the second metal layer 4054 is etched to form a source electrode 4051 and a drain electrode 4052 in the display area 410 as well as a data line 4053 on the patterned first insulation layer 403, with the source electrode 4051 being electrically connected to the data line 4053. Specifically, the source electrode 4051 and the drain electrode 4052 are at least partially formed on the pattered semiconductor layer 404 at two sides of the gate electrode 4022 respectively. Finally, the patterned third photo-resist layer 4057 is removed to form the patterned second metal layer 405 as shown in FIG. 4D. It should be appreciated that, the source electrode 4051 and the drain electrode 4052 of the patterned second metal layer 405 cover portions of the patterned semiconductor layer 404, with the data line 4053 covering the third opening 415 for electrical connection to the data connecting line 4023. It should be particularly noted that, the above descriptions are only provided to illustrate formation of the patterned second metal layer 405 but not to limit the present invention, and upon reviewing the present disclosure, those skilled in the art of semiconductor manufacturing may fabricate the patterned second metal layer 405 in other similar approaches within the scope of the present invention.

It should be noted that, in all the above embodiments, the pixel electrode 408 and the pad conductive layer 409 may be made of a same transparent conductive layer, while the data line 4053, the source electrode 4051 and the drain electrode 4052 may be made of a second metal material. In all the above embodiments, the patterned first insulation layer 4031 may have an average thickness ranging from 40 nm and 600 nm, although it is not limited thereto. In all the above embodiments, the planarization layer 418 may be made of a photo-sensitive organic material, while the second insulation layer 417 may be made of an inorganic material, for example, silicon oxide, silicon nitride or silicon oxynitride. In all the above embodiments, the patterned second insulation layer 406 and the patterned planarization layer 407 may have the same pattern. In all the above embodiments, the patterned second insulation layer 406 may have an average thickness ranging from 40 nm to 300 nm, the patterned planarization layer 407 may have an average thickness ranging from 1000 nm to 5000 nm, and the planarization layer 418 may be made of a photosensitive organic material.

It follows from the above embodiments that, by eliminating the need of a half tone mask as would otherwise be needed in the prior art, the TFT array substrate and the method for manufacturing the same according to the present invention further decrease difficulties associated with the manufacturing process and improve the yield, thereby lowering the production cost.

The above disclosure is related to the detailed technical contents and inventive features thereof People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A method for manufacturing a thin film transistor array substrate, comprising:
   providing a substrate, defining a display area, a transition area and a pad area;
   forming a patterned first metal layer in the display area, the transition area and the pad area, wherein the patterned first metal layer includes a gate line and a gate electrode disposed in the display area, a data connecting line disposed in the transition area, and a data pad and a gate pad disposed in the pad area;
   forming a patterned first insulation layer to cover the substrate and the patterned first metal layer, and defining a first opening and a second opening in the pad area and a third opening in the transition area; wherein the first opening, the second opening and the third opening are adapted to expose a portion of the gate pad, a portion of the data pad and a portion of the data connecting line respectively;
   forming a patterned semiconductor layer on the patterned first insulation layer upon the gate electrode;
   forming a patterned second metal layer on the patterned first insulation layer and covering a portion of the patterned semiconductor layer, wherein the patterned second metal layer includes a data line, a source electrode electrically connected to the data line and a drain electrode, and the data line is adapted to cover the third opening for electrical connection to the data connecting line; and
   forming a patterned second insulation layer and a patterned planarization layer to cover the display area and the transition area, wherein the patterned second insulation layer and the patterned planarization layer have a drain contact opening for exposing a portion of the drain electrode.

2. The method as claimed in claim 1, further comprising:
   forming a patterned transparent conductive layer on the patterned planarization layer and covering the exposed portion of the drain electrode, and covering the first opening and the second opening.

3. The method as claimed in claim 1, wherein the step of forming the patterned second insulation layer and the patterned planarization layer comprises:
   depositing a second insulation layer and a planarization layer;
   patterning the planarization layer to form the patterned planarization layer in the display area, the pad area and the transition area;
   etching the second insulation layer by using the patterned planarization layer as a mask to expose the gate pad and the data pad and to form the drain contact opening for exposing the drain electrode.

4. The method as claimed in claim 3, wherein the second insulation layer and the planarization layer disposed in the pad area are completely removed.

5. The method as claimed in claim 3, wherein the planarization layer is made of a photosensitive organic material.

6. The method as claimed in claim 3, wherein the second insulation layer is made of silicon oxide, silicon nitride or silicon oxynitride.

7. The method as claimed in claim 1, wherein the step of forming the patterned first metal layer comprises:
   forming a first metal layer on the substrate;
   forming a patterned first photo-resist layer on the first metal layer;
   etching the first metal layer according to the patterned first photo-resist layer to form the gate line, the gate electrode electrically connected to the gate line, the gate pad disposed at the terminal of the gate line, the data connecting line and the data pad; and
   removing the patterned first photo-resist layer.

8. The method as claimed in claim 1, wherein the step of forming the patterned first insulation layer comprises:
   forming a first insulation layer in the display area, the transition area and the pad area;
   forming a patterned second photo-resist layer on the first insulation layer;
   forming the first opening, the second opening and the third opening to expose the portion of the gate pad, the portion of the data pad and the portion of the data connecting line respectively by etching the first insulation layer according to the patterned second photo-resist layer; and
   removing the patterned second photo-resist layer.

9. The method as claimed in claim 1, wherein the step of forming the patterned second metal layer comprises:
   forming a second metal layer in the display area, the transition area and the pad area;
   forming a third patterned photo-resist layer on the second metal layer; and
   etching the second metal layer according to the patterned third photo-resist layer to form the source electrode, the drain electrode and the data line disposed on the patterned first insulation layer, wherein at least portions of the source electrode and the drain electrode are formed on the patterned semiconductor layer at two sides of the gate electrode respectively; and
   removing the patterned third photo-resist layer.

10. A thin film transistor array substrate for a liquid crystal display, comprising:
    a substrate, defining a display area, a transition area and a pad area;
    a patterned first metal layer disposed on the substrate, the patterned first metal layer including a gate line and a gate electrode in the display area, a data connecting line in the transition area and a data pad and a gate pad in the pad area;
    a patterned first insulation layer covering the substrate and the patterned first metal layer, exposing a portion of the gate pad for defining a first opening, exposing a portion of the data pad for defining a second opening and exposing a portion of the data connecting line for defining a third opening;
    a patterned semiconductor layer disposed on the patterned first insulation layer upon the gate electrode;
    a source electrode and a drain electrode, at least portions of the source electrode and the drain electrode being disposed on the patterned semiconductor layer of the two sides of the gate electrode respectively;
    a data line disposed on the patterned first insulation layer, wherein the data line covers the third opening for electrical connection to the data connecting line and electrical connection to the source electrode;
    a patterned second insulation layer covering the display area and the transition area; and
    a patterned planarization layer disposed on the patterned second insulation layer, wherein the patterned second insulation layer and the patterned planarization layer have a drain contact opening exposing a portion of the drain electrode.

11. The thin film transistor array substrate as claimed in claim 10, wherein the data line, the source electrode and the drain electrode are made of a second metal material.

12. The thin film transistor array substrate as claimed in claim 10, further comprising:
   a pixel electrode disposed on the patterned planarization layer, covering the drain contact opening for electrical connection to the drain electrode; and
   a pad conductive layer covering the first opening and the second opening, thereby electrically connecting to the gate pad and the data pad respectively.

13. The thin film transistor array substrate as claimed in claim 12, wherein the pixel electrode and the pad conductive layer are both made of a transparent conductive layer.

14. The thin film transistor array substrate as claimed in claim 12, wherein the material of the transparent conductive layer comprises ITO, IZO, or AZO.

15. The thin film transistor array substrate as claimed in claim 12, wherein the patterned first insulation has an average thickness between 40 to 600 nanometers.

16. The thin film transistor array substrate as claimed in claim 10, wherein the patterns of the patterned second insulation layer and the patterned planarization layer are the same.

17. The thin film transistor array substrate as claimed in claim 10, wherein the patterned second insulation layer has an average thickness in the range from 40 to 300 nanometers.

18. The thin film transistor array substrate as claimed in claim 10, wherein the patterned planarization layer has an average thickness in the range from 1000 to 5000 nanometers.

19. The thin film transistor array substrate as claimed in claim 10, wherein the patterned second insulation is made of an inorganic material and the patterned planarization layer is made of a photosensitive organic material.

* * * * *